United States Patent
Ben Abdelaziz

(10) Patent No.: US 10,367,503 B2
(45) Date of Patent: Jul. 30, 2019

(54) CONTROL PANEL FOR VEHICLE AND METHOD FOR MANUFACTURING SUCH CONTROL PANEL

(71) Applicant: Faurecia Interieur Industrie, Nanterre (FR)

(72) Inventor: Omar Ben Abdelaziz, Beauvais (FR)

(73) Assignee: FAURECIA INTERIEUR INDUSTRIE, Nanterre (FR)

( * ) Notice: Subject to any disclaimer, the term of this patent is extended or adjusted under 35 U.S.C. 154(b) by 104 days.

(21) Appl. No.: 15/008,011

(22) Filed: Jan. 27, 2016

(65) Prior Publication Data
US 2016/0218712 A1 Jul. 28, 2016

(30) Foreign Application Priority Data
Jan. 27, 2015 (FR) .................................. 15 50631

(51) Int. Cl.
*H03K 17/96* (2006.01)
*H01L 41/25* (2013.01)
*B60K 37/06* (2006.01)
*B60R 13/02* (2006.01)

(52) U.S. Cl.
CPC .......... *H03K 17/964* (2013.01); *B60K 37/06* (2013.01); *B60R 13/0256* (2013.01); *H01L 41/25* (2013.01); *B60K 2350/1036* (2013.01); *B60R 2013/0287* (2013.01); *H03K 2217/96042* (2013.01)

(58) Field of Classification Search
CPC ............ B60R 7/06; B60K 37/06; H01L 41/25

USPC .......................................................... 200/181
See application file for complete search history.

(56) References Cited

U.S. PATENT DOCUMENTS

| | | | | |
|---|---|---|---|---|
| 5,952,630 A * | 9/1999 | Filion | ................. | B60N 2/4693 |
| | | | | 200/302.1 |
| 6,398,349 B1* | 6/2002 | Murai | ..................... | B41J 2/161 |
| | | | | 347/68 |
| 7,280,016 B2* | 10/2007 | Taya | ...................... | B64C 21/02 |
| | | | | 200/181 |
| 7,372,348 B2* | 5/2008 | Xu | ......................... | F03G 7/065 |
| | | | | 200/181 |
| 7,597,371 B2* | 10/2009 | Gidcumb, Jr. | ...... | B60R 13/0206 |
| | | | | 296/1.08 |

(Continued)

FOREIGN PATENT DOCUMENTS

| | | | | |
|---|---|---|---|---|
| DE | 10201105339 | * | 3/2013 | ............... B60R 7/04 |
| EP | 2208645 A1 | | 7/2010 | |

(Continued)

OTHER PUBLICATIONS

International Search Report corresponding to French application No. FR 1550631, dated Dec. 1, 2015, 1 page, not translated.

*Primary Examiner* — Renee S Luebke
*Assistant Examiner* — Iman Malakooti
(74) *Attorney, Agent, or Firm* — Reising Ethington P.C.

(57) ABSTRACT

A control panel and method of making a control panel for a dashboard of a passenger compartment of a vehicle. The control panel includes a trim element, a support element and a piezoelectric film. The trim element includes at least one control area. The piezoelectric film extends between the trim element and the support element. The support element has at least one recess facing the control area.

14 Claims, 3 Drawing Sheets

(56) References Cited

U.S. PATENT DOCUMENTS

| | | | | |
|---|---|---|---|---|
| 2001/0052715 A1* | 12/2001 | McAndrew | ............ | B60K 37/06 |
| | | | | 296/37.13 |
| 2003/0197392 A1* | 10/2003 | Clark | ................... | B60N 2/4686 |
| | | | | 296/24.34 |
| 2004/0130081 A1* | 7/2004 | Hein | ...................... | B60K 37/00 |
| | | | | 267/140.14 |
| 2006/0066120 A1* | 3/2006 | Svenson | ................... | B60R 7/06 |
| | | | | 296/37.12 |
| 2008/0237005 A1* | 10/2008 | Honda | .................. | G02F 1/1368 |
| | | | | 200/181 |
| 2015/0221146 A1* | 8/2015 | Ieda | ........................ | B60R 25/24 |
| | | | | 340/5.72 |

FOREIGN PATENT DOCUMENTS

| | | | |
|---|---|---|---|
| GB | 2492100 A | 12/2012 | |
| WO | 97/11473 A1 | 3/1997 | |
| WO | 2006-131462 A1 | 12/2006 | |

\* cited by examiner

CONTROL PANEL FOR VEHICLE AND METHOD FOR MANUFACTURING SUCH CONTROL PANEL

TECHNICAL FIELD

This invention relates to a control panel intended to be arranged inside a passenger compartment of a vehicle, for example of a motor vehicle, as well as a method for manufacturing such a control panel.

More particularly, the invention relates to a control panel adapted to be arranged inside a passenger compartment of a vehicle and comprising: a trim element having an outer face intended to be oriented in the direction of the passenger compartment and an inner face opposite said outer face, with the outer face comprising at least one control area; a support element having an outer face oriented towards the inner face of the trim element and an inner face opposite said outer face; and a piezoelectric film.

BACKGROUND

Control panels of the type in question are known from the prior art. However, the existing control panels of this type require a substantial manufacturing effort with the adding of an added part, in particular on the outer face of the trim element, and of reinforcing elements, in order to allow for an optimum use of the piezoelectric film.

As such, with a concern for reducing the manufacturing time while avoiding an increase in the mass and in the price of the assembly and by providing an optimum use of the piezoelectric film, an object of this invention is to improve the existing devices.

SUMMARY

For this purpose, according to at least some embodiments of the invention, a control panel of the type in question is characterized in that the piezoelectric film extends between the trim element and the support element, in that the support element comprises at least one recess facing (in line with) the control area.

Due to this arrangement, a control panel may be provided using a piezoelectric element simply without calling into question or degrading the usage characteristics of the piezoelectric element as a result of the presence of the recess located under the control area. As such, the piezoelectric element can be deformed in such a way as to provide improved operation on the control area. Indeed, as soon as a user presses on the control area, the recess under the piezoelectric element will allow for the deformation of the piezoelectric element and the creation of an electric current that can be transmitted to connectors located under the control panel.

Embodiments of the invention may include one or the other of the following arrangements or features:
the piezoelectric film may be integrated between the trim element and the support element by over-molding the support element. A control panel comprising a piezoelectric element may be made as a result of the over-molding;
the trim element comprises a plurality of control areas, the support element comprises a plurality of recesses and to each control area corresponds a recess of the support element and a portion of piezoelectric film. Several control areas are easily created without requiring any additional parts;
the trim element comprises an aluminium material. The piezoelectric film does not interfere with the aluminium material contrary to control panels that use capacitive technologies;
the trim element comprises a layer of leather or leather substitute;
the trim element comprises a layer of carbon fibers;
the trim element comprises a layer of thermoplastic elastomers;
the trim element comprises a groove surrounding the control area. The groove allows a better deformation of the trim element;
the piezoelectric film comprises an outer face oriented towards the trim element and an inner face oriented towards the support element;
the piezoelectric film comprises a heat-activatable (thermo-reactive) adhesive material, with the heat-activatable adhesive material being arranged on the inner face and/or the outer face of the piezoelectric film. The heat-activatable material is as such activated only during the over-molding of the support element;
the piezoelectric film comprises at least one printed conductive track arranged facing the at least one recess; the printing of the conductive track is simple to implement;
the recess extends over a certain recess length, wherein the printed conductive track extends over a certain track length, and the track length is less than the recess length; as such a button zone is formed that is slightly smaller than the recess in such a way as to provide a good deformation of the piezoelectric element across its entire zone intended to generate an electric signal;
the control area extends over a certain control length, wherein the recess extends over a certain recess length, and wherein the control length is less than the recess length;
the control area extends over a certain control length, wherein the printed conductive track extends over a certain track length, and the track length is equal to the control length;

This invention also relates to a dashboard for a vehicle provided with a control panel such as described.

This invention also relates to a method for manufacturing a control panel intended to be arranged inside a passenger compartment of a vehicle, which in at least some embodiments comprising the steps:
making available an injection molding machine with a mold,
providing a trim element having an outer face intended to be oriented in the direction of the passenger compartment and an inner face opposite said outer face, with the outer face comprising at least one control area,
positioning the trim element in the mold,
providing a piezoelectric film comprising an inner face and an outer face,
positioning and maintaining in position of the piezoelectric film in the mold, with the outer face of the piezoelectric film being arranged on the inner face of the trim element,
forming of a support element by over-molding in the mold of material on a portion of the inner face of the piezoelectric film, with the support element formed having an outer face oriented towards the inner face of the trim element and an inner face opposite said outer face and a recess facing (in line with) the control area, and integrating the piezoelectric film between the trim element and the support element during the step of overmolding the support element.

In an alternative embodiment of the method, the outer face of the piezoelectric film adheres to the trim element, and wherein the inner face of the piezoelectric film adheres to the support element during the injection of material into the mold.

According to an alternative embodiment, the maintaining of the piezoelectric film in position in the mold is carried out by suction and/or by mechanical maintaining.

BRIEF DESCRIPTION OF THE DRAWINGS

Other characteristics and advantages of the invention shall appear when reading the following description of one of its embodiments, provided by way of a non-limiting example, with respect to the attached drawings.

In the drawings.

DETAILED DESCRIPTION

In the various figures, the same references designate similar or identical elements.

Here, in the following description, the term "piezoelectric film" is to be interpreted in the broad sense in order to include a film that comprises one or several piezoelectric elements.

Figure 1:
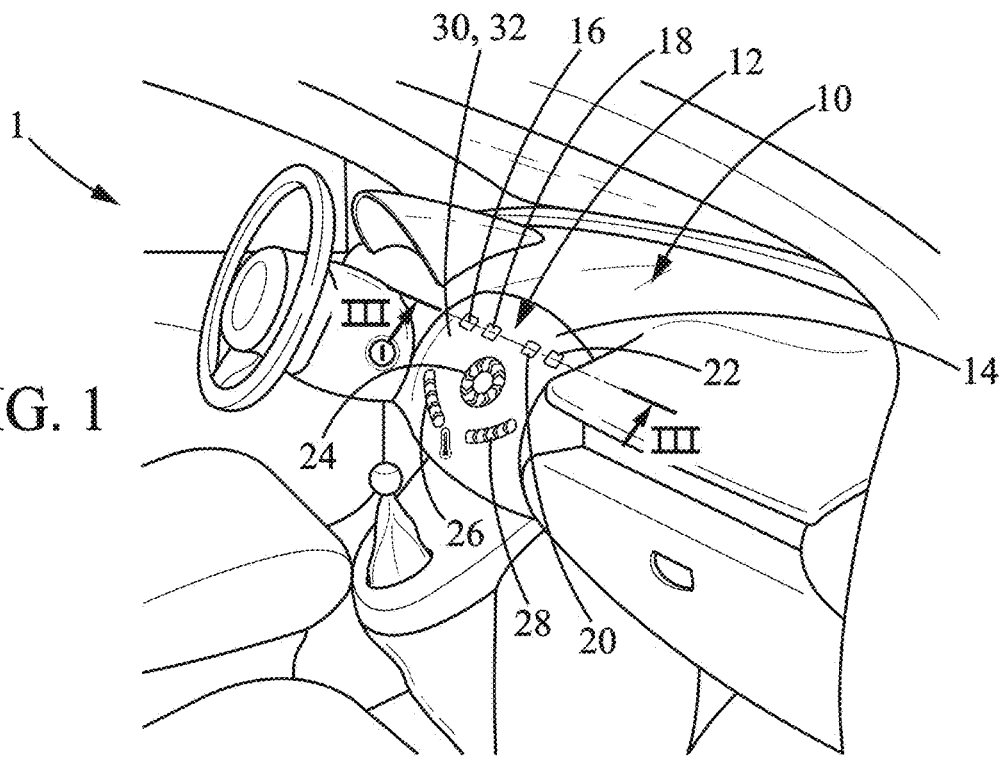
FIG. 1 is a schematic view of a passenger compartment of a vehicle comprising a dashboard provided with a control panel according to the invention.

FIG. 1 shows a passenger compartment of a motor vehicle 1 with a dashboard 10. The dashboard 10 comprises a control panel 12. The control panel 12 comprises an outer face 14 oriented in the direction of the passenger compartment. The control panel 12 comprises a control area 16, 18, 20, 22, 24, 26, 28. The control area 16, 18, 20, 22, 24, 26, 28 can be seen on the outer face 14 of the control panel 10 and is reachable (can be accessed) from the passenger compartment 1. The control area 16, 18, 20, 22, 24, 26, 28 can for example be touched with a finger by a user of the vehicle in order to control the activation and or deactivate the features of the vehicle such as for example hazard lights, centralised locking of the vehicle, an anti-skid system, a parking brake, or to adjust the intensity of a ventilation system or others.

Such as shown in FIG. 1 the control panel 12 comprises several control areas 16, 18, 20, 22, 24, 26, 28. However, it is possible that the control panel 12 comprises only a single control area.

In the embodiment shown in FIG. 1, the various control areas 16, 18, 20, 22, 24, 26, 28 present on the outer face of the control panel 12 are indicated by markings that are visible for an occupant of the vehicle and/or by markings that can be felt to the touch by an occupant of the vehicle, such as elements in relief. Alternatively, it can be provided that only the envelopes inside of which extend the various control areas be indicated by such markings.

Figure 3:
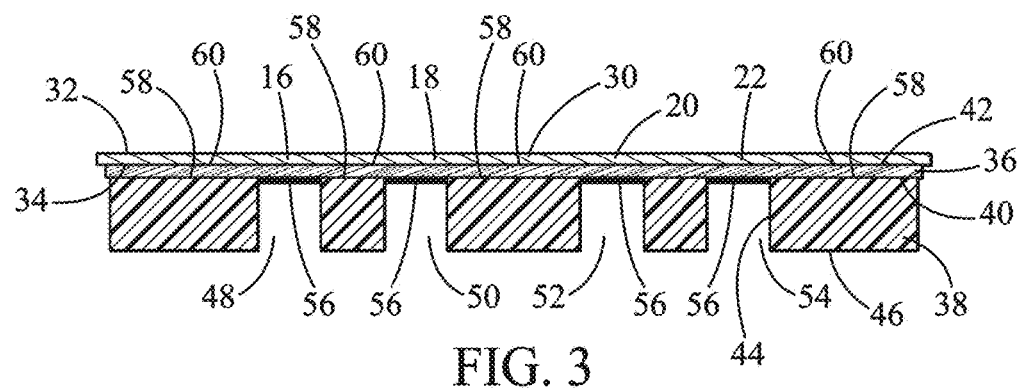
FIG. 3 is a schematic view as a cross-section according to the line III-III of FIG. 1 of the control panel.

As can be seen in FIG. 3, the control panel 12 comprises a trim element 30. The trim element has an outer face 32 intended to be oriented in the direction of the passenger compartment and an inner face 34 opposite said outer face 32. The outer face 32 of the trim element can be seen and can be accessed from the passenger compartment 1 by an occupant of the vehicle. The outer face 32 comprises at least one control area 16, 18, 20, 22, 24, 26, 28.

The control panel 12 also comprises a piezoelectric film 36 (visible in FIG. 3). The piezoelectric film 36 is arranged between a support element 38 of the control panel 12 and the trim element 40 of the control panel 12. More precisely, the piezoelectric film 36 comprises an inner face 40 and an outer face 42, opposite the inner face 40.

The piezoelectric film 36 makes it possible to produce electricity when said piezoelectric film 36 is deformed, folded or pressed. The piezoelectric film 36 is in particular integrated facing (in line with) the control area 16, 18, 20, 22, 24, 26, 28.

The piezoelectric film 36 can be carried out by different processes or methods.

Figure 4:
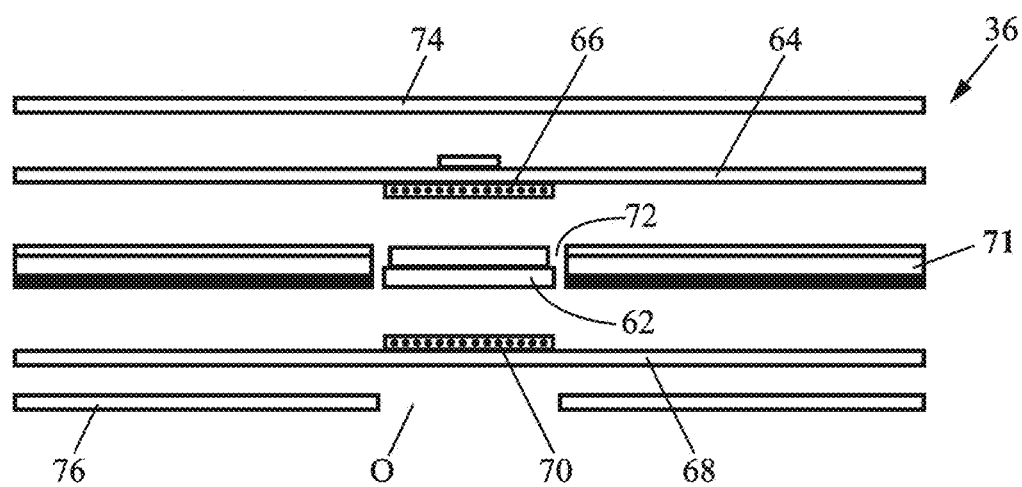
FIG. 4 is a schematic view as a cross-section of a piezoelectric film according to a first embodiment.

For example, as shown in FIG. 4, the piezoelectric film 36 comprises a piezoelectric disc 62 or even a piezoelectric membrane. The piezoelectric disc 62 is arranged between an upper film 64 comprising an upper electrode 66 and a lower film 68 comprising a lower electrode 70. The upper and lower electrodes 66, 70 are in line with the piezoelectric disc 62, on either side of the latter. In alternative embodiments, several piezoelectric discs 62 can be provided. In order to maintain a constant separation between the lower and upper films 68, 64 comprising the lower and upper electrodes 70, 66 and/or between the piezoelectric discs 62, in the case of a piezoelectric film comprising several piezoelectric elements for example, a spacer film 71 can be provided. The spacer film 71 can comprise an orifice 72 inside of which the piezoelectric disc 62 is placed. For example the spacer film 71 comprises several orifices 72 and a piezoelectric disc 62 is positioned inside each orifice 72.

The positioning of the piezoelectric disc 62 can be carried out by a motorised arm for example. The unit thus constituted can then be sandwiched between two layers of film 74, 76 comprising an adhesive. The layer of film 76 underneath the lower film 68 comprising the lower electrode 70 is here provided with an orifice O in order to allow for a deformation of the piezoelectric disc 62.

On either side of the piezoelectric film 36 constituted as such can be arranged a support element and a trim element.

Such a piezoelectric film 36 makes it possible in particular to provide good sensitivity of the detection zone. Such a piezoelectric film 36 also makes it possible to carry out a haptic feedback. The haptic feedback would in particular make it possible to confirm to a user that the control was indeed taken into account. The piezoelectric disc or the piezoelectric membrane has for example a flat circular shape. In the case of a piezoelectric film allowing for a haptic feedback, the diameter of the piezoelectric disc or of the piezoelectric membrane will be for example at least 20 millimeters (mm). The haptic feedback can be adapted to the control area to command. For example, in case of several control areas, the haptic feedback can be different from a first control area to a second control area, depending of the device to be controlled.

Figure 5:
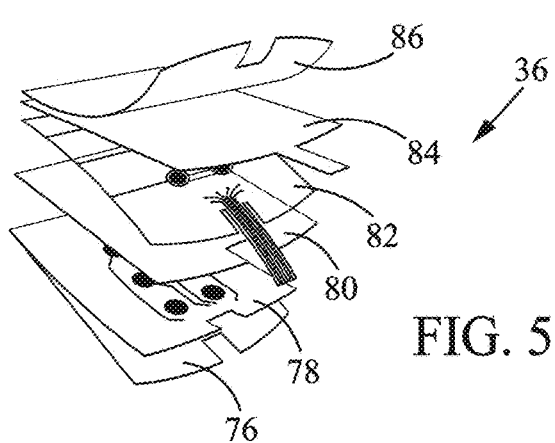
FIG. 5 is a schematic view of a piezoelectric film according to a second embodiment.

In a second embodiment, the piezoelectric film can be carried out by printing, as shown in particular in FIG. 5. One or several piezoelectric elements can be printed on a film.

For the printing of such a piezoelectric film, a rotating method of printing, known under the "Roll to Roll" method name can be used. This type of method allows in particular a high volume and production speed as well as an extended printable surface, as well as a repeatability of the method and little loss of material. The piezoelectric film 36 carried out as such comprises for example, as shown in FIG. 5, a dielectric layer 76, a first conductive layer 78, a SIM layer 80, a second conductive layer 82, a polyester film 84 and an adhesive film 86.

On either side of the piezoelectric film 36 constituted as such can be arranged a support element and a trim element.

A piezoelectric film 36 carried out by a rotating method of printing makes it possible in particular to provide good resistance to temperature, to allow for the carrying out of three-dimensional shapes (or in volume), to allow for printing over an extended surface. It is as such possible to over-mound without problems the piezoelectric film 36 obtained as such and the costs for producing such a piezoelectric film 36 are low.

The control panel 12 also comprises the support element 38, as mentioned hereinabove. The support element 38 has an outer face 44 oriented towards the inner face 40 of the trim element 30 and an inner face 46 opposite said outer face 44. The support element 38 is directly over-molded on the piezoelectric film 36.

As can be seen in FIG. 3, the piezoelectric film 36 extends over a certain surface between the trim element 30 and the support element 38. For example, the piezoelectric film 36 extends over the entire surface of the control panel 12.

The inner face 40 of the piezoelectric film 36 rests on the outer face 44 of the support element 38. The outer face 42 of the piezoelectric film 36 rests on the inner face 34 of the trim element 30.

During the over-molding of the support element 38, at least one recess 48, 50, 52, 54 is directly created which is formed in line with the control area 16, 18, 20, 22, 24, 26, 28. Hence, the at least one recess 48, 50, 52, 54 is formed facing the piezoelectric film 36.

The piezoelectric film 36 is directly integrated between the trim element 30 and the support element 38 during the over-molding of the support element 38. The recess 48, 50, 52, 54 created under the piezoelectric film 36 allows the piezoelectric film 36 to be deformed when a user presses on the trim element 30 in line with the recess 48, 50, 52, 54.

In an embodiment, the piezoelectric film 36 is embedded between the trim element 30 and the support element 38 by gluing. In this embodiment, the recess 48, 50, 52, 54 is performed before gluing the piezoelectric film 36.

As such, by placing the recess opposite the control area 16, 18, 20, 22, 24, 26, 28, the user who presses on the control area 16, 18, 20, 22, 24, 26, 28 deforms the piezoelectric film 36. For example, the recess 48, 50, 52, 54 extends over a certain recess length. The control area 16, 18, 20, 22, 24, 26, 28 extends over a certain control length. The control length is less than the recess length.

The piezoelectric film 36 is printed facing the control area 16, 18, 20, 22, 24, 26, 28 with conductive circuits 56 (also called conductive tracks), as can be seen in FIG. 3. The deformation of the piezoelectric film 36 in line with recesses 48, 50, 52, 54 (facing the control area 16, 18, 20, 22, 24, 26, 28) generates an electric signal. The electric signal is transmitted to the conductive circuits that transport the electric signal to a connector or connectors (not shown) provided under the control panel 12. These connectors will then control the activation and or deactivate features of the vehicle such as those described hereinabove.

Figure 2:
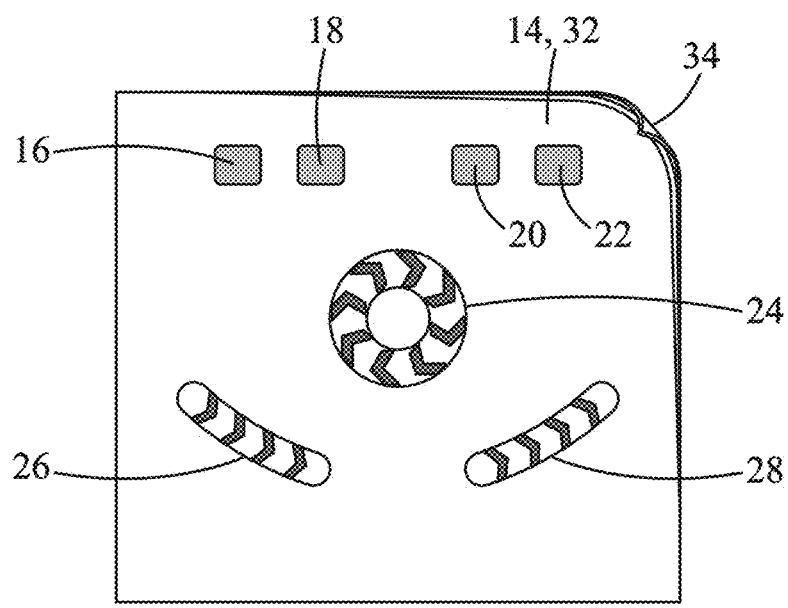
FIG. 2 is a flat view of an example of the outer face of a trim element.

Such as shown in FIG. 2, the trim element 30 comprises seven separate control areas 16, 18, 20, 22, 24, 26, 28. However, more or less than seven control areas 16, 18, 20, 22, 24, 26, 28 can be provided. To each control area 16, 18, 20, 22, 24, 26, 28 corresponds a recess 48, 50, 52, 54. The piezoelectric film 36 is for example continuous. The piezoelectric film 36 extends below all of the control areas 16, 18, 20, 22, 24, 26, 28 and extends even beyond these control areas 16, 18, 20, 22, 24, 26, 28.

In FIG. 3, which is a cross-section view according to of FIG. 1, four control areas 16, 18, 20, 22, 24, 26, 28 can be seen. As shown in FIG. 3, to each control area 16, 18, 20, 22, 24, 26, 28 of the trim element 30 corresponds a recess 48, 50, 52, 54 of the support element 38. More particularly, as can be seen in FIG. 3, four recesses 48, 50, 52, 54 are provided in line with control areas 16, 18, 20, 22, 24, 26, 28. The four recesses 48, 50, 52, 54 are formed directly during the over-molding of the support element 38. The piezoelectric film 36 extends over the entire surface between the support element 38 and the trim element 30.

The piezoelectric film 36 comprises button areas. The button areas comprise the printed portions of conductive tracks 56 (also referred to as conductive circuits 56). As mentioned hereinabove, the conductive tracks 56 convey an electric signal to connectors provided at the rear of the control panel in order to transmit the control signal from the user to the interface to be controlled. The conductive tracks 56 are printed on the inner face 40 of the piezoelectric film 36. For example, the printed conductive track 56 extends over a certain track length, and the track length is less than the recess length.

The zones (or areas) of the support element 38 in direct contact with the piezoelectric film 36, in particular in the vicinity of the piezoelectric film 36, make it possible to rigidify the areas of the piezoelectric film 36 that are not intended to be deformed. In other terms, the zones of the reinforcing element in direct contact with the piezoelectric film 36 are located opposite portions of the trim element 30 that do not comprise control areas 16, 18, 20, 22, 24, 26, 28. The reinforcing element or support element can comprise a plastic material.

The piezoelectric film is integrated into the trim element 30 and into the support element 38 during the over-molding of the support element 38.

As such, in order to manufacture the control panel 12, a mold is firstly provided. The trim element 30 is arranged in a first step in this mold. Over the trim element 30, the piezoelectric film 36 is deposited. When depositing the piezoelectric film 36, it is ensured that the zones comprising printed conductive tracks 56 on the piezoelectric film 36 are opposite zones intended to form the control areas on the trim element 30. The piezoelectric film 36 can be maintained in position in the mold on the trim element 30 for example by suction. Other systems for maintaining the piezoelectric film 36 in the mold can be provided, such as for example a system for mechanical maintaining with clamps or clips. Adhesive zones 58, 60 can be provided on the piezoelectric film 36 in order to allow said piezoelectric film 3 to adhere to the trim element 30 and/or to the support element 38. For example, the adhesive zones 58, 60 can be activated under the effect of the heat during the over-molding of the support element 38. The adhesive zones 58, 60, carried out for example via hot-melt glues, can be printed directly on the piezoelectric film 36. For example, an adhesive zone 58 is provided on the outer face 42 of the piezoelectric film 36.

Under the effect of the heat, the adhesive zone 58 is activated in such a way that the piezoelectric film 36 sticks to the trim element 30.

The trim element 30 comprises for example an aluminium material. However, other materials can be provided. For example in alternative embodiments, the trim element 30 comprises a carbon fiber layer, an aluminium layer, a wood layer, a glass layer and/or a mineral layer (for example schist stones like mica or slate). The trim element 30 can also comprises a layer of leather and/or a layer of leather substitute and/or a layer in synthetic resin such as a thermoplastic material or thermoplastic elastomers. These layers form a decorative layer of the trim element 30.

For example, if the trim element 30 comprises a layer of a material (the material can be one or some of the previously mentioned materials such as leather, thermoplastic elastomers, carbon, etc.) which can be provided with a surface treatment in order to avoid a premature wear of these control area 16, 18, 20, 22, 24, 26, 28. A thin layer of foam can be provided under the layer of material and more particularly at the location of the control area 16, 18, 20, 22, 24, 26, 28 to give a spring effect to the user when pressing the control area 16, 18, 20, 22, 24, 26, 28. The control panel 12 can thus be manufactured with the following steps: preparing the layer of material (make the necessary cutting, treatment, marking, and/or sewing). The piezoelectric film 36 can then be fixed to the support element 38, for example glue can be used. An electronic card can then be assembled to the support element 38.

The trim element 30 can also comprising for example a layer of thermoplastic elastomers can be equipped with a backlight system to identify the control area 16, 18, 20, 22, 24, 26, 28 and/or with a translucent area. In such case, a lighting device is provided and connected to the trim element 30.

Figure 6:
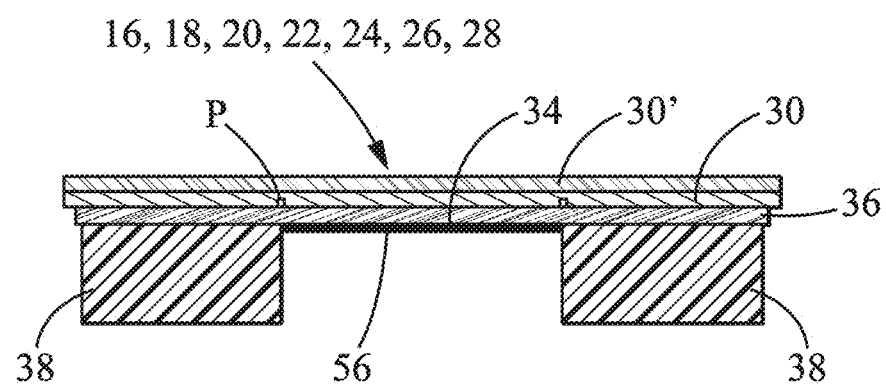
FIG. 6 is a schematic view as a cross-section of a control panel according to an embodiment of the present invention, in which a groove can be seen.

The trim element 30, in particular a trim element comprising a layer of carbon or aluminium or wood, can comprise a transparent layer 30' (as illustrated in FIG. 6). For example the transparent layer can comprise polyurethane material. The layer with carbon fiber can be over-molded on the transparent layer. This molding technique facilitates handling of the assembly (transparent layer and decorative layer).

The inner face 34 of the trim element 30, in particular a trim element comprising a layer of carbon or aluminium or wood, can comprise in a groove P (see FIG. 6) which forms a peripheral area surrounding the control area 16, 18, 20, 22, 24, 26, 28. More particularly, the peripheral area of the trim element 30 surrounding the control area 16, 18, 20, 22, 24, 26, 28 can comprise a thickness which is smaller than the thickness of the rest of the trim element 30. Such weakening allows a better deformation of the area direct above the printed conductive track. In other words, the peripheral area P forms a groove in the trim element 30. The groove can be performed by a laser or by compression before or during the overmoding.

Implementing a piezoelectric film 36 in a control panel comprising a trim element 30 made of aluminium material is particularly advantageous, as the aluminium does not interfere with the piezoelectric film 36.

The invention claimed is:

1. Control panel for use in a passenger compartment of a vehicle and comprising:
   a trim element having an outer face intended to be oriented in the direction of the passenger compartment and an inner face opposite said outer face, the outer face comprising at least one control area,
   a support element having an outer face oriented towards the inner face of the trim element and an inner face opposite its outer face, the support element comprising at least one recess in line with the control area, and
   a piezoelectric film extending between the trim element and the support element, the piezoelectric film having an inner face and an outer face,
   wherein the piezoelectric film extends across the control area and beyond the control area so that the outer face of the piezoelectric film rests on the inner face of the trim element and the inner face of the piezoelectric film rests on the outer face of the support element around the control area.

2. Control panel according to claim 1, wherein the piezoelectric film is integrated between the trim element and the support element by over-molding the support element.

3. Control panel according to claim 1, wherein the trim element comprises a plurality of control areas, the support element comprises a plurality of recesses, and to each control area corresponds a recess of the support element and a portion of piezoelectric film.

4. Control panel according to claim 1, wherein the trim element comprises an aluminum material.

5. Control panel according to claim 1, wherein the trim element comprises a layer of leather or leather substitute.

6. Control panel according to claim 1, wherein the trim element comprises a layer of carbon fibers.

7. Control panel according to claim 1, wherein the trim element comprises a layer of thermoplastic elastomers.

8. Control panel according to claim 1, wherein the piezoelectric film comprises a thermo-reactive adhesive material, with the thermo-reactive adhesive material being arranged on the inner face and/or the outer face of the piezoelectric film.

9. Control panel according to claim 1, wherein the piezoelectric film comprises at least one printed conductive track arranged facing the at least one recess.

10. Control panel according to claim 9, wherein the recess extends over a certain recess length, wherein the printed conductive track extends over a certain track length, and the track length is less than the recess length.

11. Control panel according to claim 1, wherein the trim element comprises a groove surrounding the control area.

12. Dashboard for vehicle provided with a control panel for use in a passenger compartment of a vehicle and comprising:
    a trim element having an outer face intended to be oriented in the direction of the passenger compartment and an inner face opposite said outer face, the outer face comprising at least one control area,
    a support element having an outer face oriented towards the inner face of the trim element and an inner face opposite its outer face, the support element comprising at least one recess in line with the control area, and
    a piezoelectric film extending between the trim element and the support element, the piezoelectric film having an inner face and an outer face,
    wherein the piezoelectric film extends across the control area and beyond the control area so that the outer face of the piezoelectric film rests on the inner face of the trim element and the inner face of the piezoelectric film rests on the outer face of the support element around the control area.

13. Control panel according to claim 1, wherein the piezoelectric film is in contact with and supported by the support element outside the control area and not in contact with or supported by the support element at the recess such that deformation of the piezoelectric film with respect to the support element is permitted at the control area but not outside the control area when a user presses the control area.

14. Control panel for use in a passenger compartment of a vehicle and comprising:
- a trim element having an outer face intended to be oriented in the direction of the passenger compartment and an inner face opposite said outer face, the outer face comprising at least one control area,
- a support element having an outer face oriented towards the inner face of the trim element and an inner face opposite its outer face, the support element comprising at least one recess in line with the control area, and
- a piezoelectric film extending between the trim element and the support element, the piezoelectric film having an inner face and an outer face,
- wherein the inner face of the piezoelectric film rests on the outer face of the support element and the outer face of the piezoelectric film rests on the inner face of the trim element, and
- wherein the piezoelectric film is integrated between the trim element and the support element, the support element being molded over the piezoelectric film and the trim element.

* * * * *